(12) United States Patent
Nguyen et al.

(10) Patent No.: US 9,363,130 B2
(45) Date of Patent: Jun. 7, 2016

(54) DYNAMIC DIGITAL PREDISTORTION FOR A MICROWAVE RADIO SYSTEM

(71) Applicant: ZTE (USA) Inc, Richardson, TX (US)

(72) Inventors: Thanh Hung Nguyen, Cary, NC (US); Ying Shen, Chapel Hill, NC (US); Andrey Kochetkov, Carey, NC (US); Aleksandr Semenyshev, Apex, NC (US); William Schmid, Holly Spring, NC (US)

(73) Assignee: ZTE (USA) INC., Austin, TX (US)

( * ) Notice: Subject to any disclaimer, the term of this patent is extended or adjusted under 35 U.S.C. 154(b) by 108 days.

(21) Appl. No.: 14/081,977

(22) Filed: Nov. 15, 2013

(65) Prior Publication Data
US 2014/0133531 A1    May 15, 2014

Related U.S. Application Data

(60) Provisional application No. 61/726,978, filed on Nov. 15, 2012.

(51) Int. Cl.
| | |
|---|---|
| *H04L 25/08* | (2006.01) |
| *H04L 27/36* | (2006.01) |
| *H03G 3/30* | (2006.01) |
| *H04B 1/62* | (2006.01) |
| *H03F 1/32* | (2006.01) |
| *H04L 27/38* | (2006.01) |

(52) U.S. Cl.
CPC ............ *H04L 27/367* (2013.01); *H03F 1/3241* (2013.01); *H03G 3/3042* (2013.01); *H03F 1/32* (2013.01); *H03F 2200/372* (2013.01); *H03F 2200/451* (2013.01); *H04B 1/62* (2013.01); *H04L 27/368* (2013.01); *H04L 27/38* (2013.01)

(58) Field of Classification Search
CPC ... H03F 1/3241; H03F 1/32; H03F 2200/372; H03F 2200/451; H04B 1/62; H04L 27/367; H04L 27/368; H04L 27/38
See application file for complete search history.

(56) References Cited

U.S. PATENT DOCUMENTS

| | | | | |
|---|---|---|---|---|
| 5,627,857 | A * | 5/1997 | Wilson | H03F 1/3241 375/219 |
| 6,711,217 | B1 * | 3/2004 | Jeong | H03F 1/3229 330/149 |
| 6,738,057 | B1 * | 5/2004 | Campbell | H04N 5/217 345/611 |

* cited by examiner

*Primary Examiner* — Ross Varndell
(74) *Attorney, Agent, or Firm* — Morgan, Lewis & Bockius LLP (57) ABSTRACT

A method for performing digital predistortion to a microwave radio transceiver in response to an increase/decrease of transmit power level is disclosed. If the new transmit power level is higher than the current transmit power level, a set of digital predistortion (DPD) coefficients is applied to the transceiver before the issuance of a transmit power level increase command to the transceiver. Otherwise, a transmit power level decrease command is issued to the transceiver before the application of the set of DPD coefficients to the transceiver. Determining the set of DPD coefficients for the transceiver involves two stages: (i) calibrating the transceiver at a room temperature under predefined conditions and generating a DPD lookup table including DPD coefficients at a plurality of predefined temperatures other than the room temperature and (ii) determining the set of DPD coefficients for a given set of operating conditions using entries in the DPD lookup table.

15 Claims, 7 Drawing Sheets

DYNAMIC DIGITAL PREDISTORTION FOR A MICROWAVE RADIO SYSTEM

RELATED APPLICATION

The present invention claims priority to U.S. Provisional Application No. 61/726,978, "Dynamic Digital Predistortion for a Microwave Radio System," filed on Nov. 15, 2012, which is hereby incorporated by reference in its entirety.

TECHNICAL FIELD

The present invention generally relates to wireless telecommunication, and in particular, to system and method for dynamically performing digital predistortion for a microwave radio transceiver.

BACKGROUND

Multi-level linear modulation schemes such as M-ary Quadrature Amplitude Modulation (QAM) are commonly used in today's microwave radio systems to provide spectrally efficient radio communications for mobile backhaul and other applications. Due to the non-constant envelope of these modulation schemes, they are more sensitive to the power amplifier non-linearity. Among many linearization techniques, predistortion is a commonly used technique that involves the insertion of a non-linear element prior to the power amplifier such that the combined transfer function is a linear one. For example, the open-loop digital predistortion (DPD) models the non-linearity of the power amplifier as an odd-order polynomial, each predistortion polynomial coefficient being a complex number represented by a pair of real and imaginary components. Since the performance of a power amplifier varies with its operating conditions, e.g., frequency, channel bandwidth, temperature, etc., the predistortion coefficients to be applied to the power amplifier should be updated accordingly to keep track of the changes in the operating conditions.

SUMMARY

In accordance with some embodiments, a microwave radio transceiver control system includes: an adaptive transmit power control (ATPC) engine for receiving a received signal strength indication (RSSI), determining a new transmit power level for the microwave radio transceiver in accordance with the RSSI, and issuing a transmit power level increase/decrease command to the microwave radio transceiver and a digital predistortion (DPD) engine for determine a set of DPD coefficients to be applied to the microwave radio transceiver in accordance with the new transmit power level. If the new transmit power level is higher than the microwave radio transceiver's current transmit power level, the DPD engine is configured to apply the set of DPD coefficients to the microwave radio transceiver; and the ATPC engine is configured to issue a transmit power level increase command to the microwave radio transceiver after a first predefined time interval following the application of the set of DPD coefficients to the microwave radio transceiver. If the new transmit power level is lower than the microwave radio transceiver's current transmit power level, the ATPC engine is configured to issue a transmit power level decrease command to the microwave radio transceiver and the DPD engine is configured to apply the set of DPD coefficients to the microwave radio transceiver after a second predefined time interval following the issuance of the transmit power level decrease command to the microwave radio transceiver.

In some embodiments, the DPD engine is configured to perform a query over a DPD lookup table in accordance with a predefined set of operating conditions and the new transmit power level to determine the set of DPD coefficients.

In some embodiments, the DPD engine is configured to provide the determined set of DPD coefficients to a modem and the modem is configured to use the set of DPD coefficients to modify an analog signal in accordance with a predefined odd-order polynomial and apply the analog signal to the microwave radio transceiver.

In some embodiments, each of the set of DPD coefficients is a complex number represented by a pair of real and imaginary components.

In some embodiments, the microwave radio transceiver includes a power amplifier to which the set of DPD coefficients is applied.

In some embodiments, the predefined set of operating conditions includes one or more parameters selected from the group consisting of a radio frequency, a channel bandwidth, a modulation index, a transmit power level, and temperature of the power amplifier.

In some embodiments, the first predefined time interval is 5 ms.

In some embodiments, the second predefined time interval is 100 ms.

In accordance with some embodiments, a method for performing digital predistortion to a microwave radio transceiver includes: receiving a received signal strength indication (RSSI); and in response to the RSSI: determining a new transmit power level for the microwave radio transceiver; and performing a query over a DPD lookup table in accordance with a predefined set of operating conditions and the new transmit power level to determine a set of DPD coefficients to be applied to the microwave radio transceiver. If the new transmit power level is higher than the microwave radio transceiver's current transmit power level, the set of DPD coefficients is applied to the microwave radio transceiver and a transmit power level increase command issued to the microwave radio transceiver after a first predefined time interval following the application of the set of DPD coefficients to the microwave radio transceiver. If the new transmit power level is lower than the microwave radio transceiver's current transmit power level, a transmit power level decrease command is issued to the microwave radio transceiver and the set of DPD coefficients is applied to the microwave radio transceiver after a second predefined time interval following the issuance of the transmit power level decrease command to the microwave radio transceiver.

In some embodiments, the set of DPD coefficients is applied to a modem and the modem is configured to use the set of DPD coefficients to modify an analog signal in accordance with a predefined odd-order polynomial and apply the analog signal to the microwave radio transceiver.

In some embodiments, each of the set of DPD coefficients is a complex number represented by a pair of real and imaginary components.

In some embodiments, the microwave radio transceiver includes a power amplifier and the set of DPD coefficients is to be applied to the power amplifier.

In some embodiments, the predefined set of operating conditions includes one or more parameters selected from the group consisting of a radio frequency, a channel bandwidth, a modulation index, a transmit power level, and temperature of the power amplifier.

In some embodiments, the first predefined time interval is 5 ms.

In some embodiments, the second predefined time interval is 100 ms.

In accordance with some embodiments, a method for determining a set of digital predistortion (DPD) coefficients for a microwave radio transceiver under a given set of operating conditions, the method includes: calibrating the microwave radio transceiver at a room temperature, the calibrating including determining multiple sets of DPD coefficients for the microwave radio transceiver at the room temperature, each set of DPD coefficients corresponding to a respective set of predefined conditions; predicting DPD coefficients for the microwave radio transceiver at a plurality of predefined temperatures other than the room temperature in accordance with the multiple sets of DPD coefficients determined at the room temperature and a set of predefined correction factors; generating a DPD lookup table for the microwave radio transceiver using the predicted DPD coefficients at the plurality of predefined temperatures; performing a query of the DPD lookup table in accordance with the given set of operating conditions to identify one or more entries in the DPD lookup table; and determining a set of DPD coefficients for the given set of operating conditions using the identified one or more entries in the DPD lookup table.

In some embodiments, the respective set of predefined conditions specifies a radio frequency, a channel bandwidth, a modulation index, a transmit power level, and temperature of the power amplifier for the microwave radio transceiver.

In some embodiments, the set of predefined correction factors is derived from measurement data collected from a plurality of sample microwave radio transceivers, the measurement data corresponding to multiple combinations of temperatures, radio frequencies, channel bandwidths, modulation indexes, and transmit power levels.

In some embodiments, at least one of the predefined correction factors is a difference between a set of DPD coefficients associated with the plurality of sample microwave radio transceivers at a particular channel bandwidth and a set of DPD coefficients associated with the plurality of sample microwave radio transceivers averaged over a plurality of channel bandwidths.

In some embodiments, the given set of operating conditions includes one or more parameters selected from the group consisting of a radio frequency, a channel bandwidth, a modulation index, a transmit power level, and temperature of the power amplifier.

In some embodiments, the set of DPD coefficients for the given set of operating conditions is derived from the identified one or more entries in the DPD lookup table through linear interpolation.

BRIEF DESCRIPTION OF THE DRAWINGS

Different aspects of the present invention as well as features and advantages thereof will be more clearly understood hereinafter because of a detailed description of embodiments of the present invention when taken in conjunction with the accompanying drawings, which are not necessarily drawn to scale. Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details. For example, it will be apparent to one of ordinary skill in the art that the subject matter presented herein can be implemented on many types of microwave radio systems.

Today's microwave radio transceivers commonly offer the following features:
  Frequency agility—the same hardware is expected to operate over a wide range of radio frequency.
  Variable channel bandwidths—the channel bandwidth may range from a very narrow band such as 2.5 MHz to a very wide band such as 112 MHz.
  Adaptive transmit power control (ATPC)—the transceiver's transmit power varies adaptively over a typical range of up to 30 dB to counter the effect of fading activity over the radio link.
  Mixed-mode operation—the modulation index can be adaptively changed in order to maintain a good signal-to-noise ratio (SNR) in adverse propagation conditions, thus improving the availability of high-priority payloads.
  Wide operational temperature range—the same hardware needs to be able to function normally at different temperatures at different indoor/outdoor installations.

In order to achieve an optimal performance under a wide range of operating conditions described above, a digital predistortion implementation scheme needs to calibrate its predistortion coefficients dynamically. In some embodiments, a manufacturer calibrates a microwave radio transceiver at the manufacturing site by determining the predistortion coefficients for the transceiver under a range of operating conditions and pre-storing these coefficients in a look-up table (LUT) of the transceiver. At the operation site, an appropriate set of predistortion coefficients is derived from the LUT and loaded into a modem coupled to the transceiver based on the current operating conditions such as frequency, channel bandwidth, modulation index, transmit power level, and temperature, etc.

Figure 1:
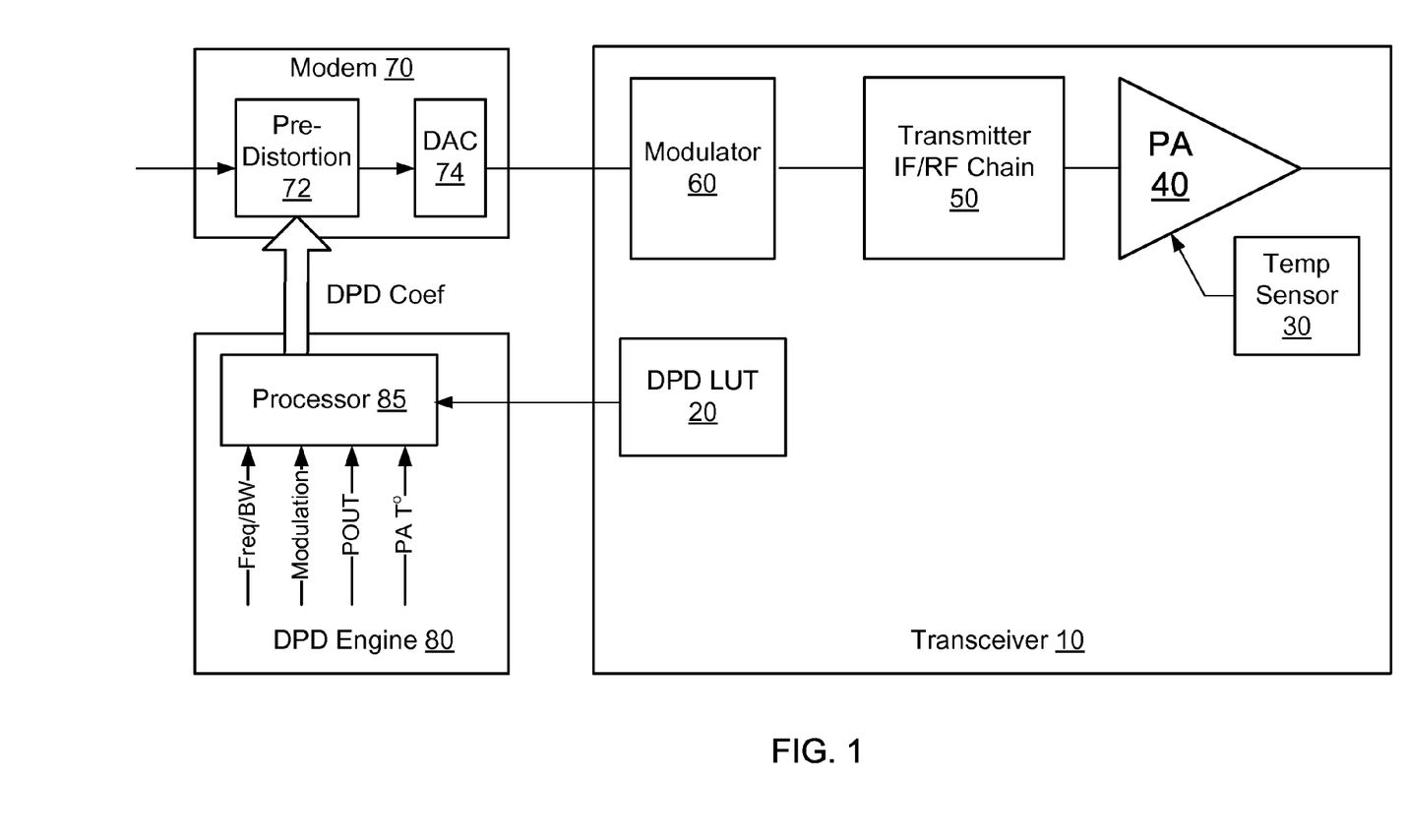
FIG. 1 depicts a block diagram of performing digital predistortion to a power amplifier within a microwave radio transmitter in accordance with some embodiments of the present invention.

FIG. 1 depicts a block diagram of performing digital predistortion to a power amplifier 40 within a microwave radio transmitter 10 in accordance with some embodiments of the present invention. As shown in the figure, the transceiver 10 includes a DPD LUT 20 for storing the predistortion coefficients pre-determined by the manufacturer of the transceiver 10 and a temperature sensor 30 for determining the temperature of the power amplifier 40. The DPD engine 80 includes a processor 85 for generating a set of DPD coefficients for a given set of operating conditions. For example, at the system power-up, the processor 85 receives, at its input terminals, a set of parameters including frequency, channel bandwidth, modulation index, transmit power level, temperature, etc. representing the current operating conditions. Based on the input parameters, the processor 85 queries the DPD LUT 20 in the transceiver 10 and receives one or more sets of pre-calculated predistortion coefficients. If there is a set of pre-calculated predistortion coefficients corresponding to the current operating conditions, the processor 85 then forwards this set of predistortion coefficients to the modem 70. More often than not, the processor may receive multiple sets of pre-calculated predistortion coefficients from the LUT 20 since there is no one set of pre-calculated predistortion coefficients corresponding to the current operating conditions. In this case, the processor 85 may predict a set of predistortion coefficients corresponding to the current operating conditions from the multiple sets of pre-calculated predistortion coefficients using methods such as linear interpolation.

Within the modem 70, a predistortion module 72 receives the set of predistortion coefficients and applies the predistortion coefficients to an input digital signal. Next, a digital-analog converter (DAC) 74 converts the processed digital signal into an analog signal and submits the analog signal to one or more components in the transceiver 10 for further processing before the signal reaches the power amplifier 40. As shown in FIG. 1, exemplary components located along the signal path but before the power amplifier 40 includes a modulator 60 and a transmitter IF/RF chain 50, etc. Because of the digital predistortion to the input signal, the power amplifier 40 has an improved linear performance. Note that the details of how the predistortion coefficients improve the linearity of the power amplifier are skipped since they are well known in the art. For more information, please refer to "Adaptive Linearization of Power Amplifiers in Digital Radio Systems" by A. A. M. Saleh and J. Salz, Bell System Technical Journal, Vol. 62, No. 4, April 1983, which is incorporated by reference in its entirety.

Note that the fact that the performance of a power amplifier varies with its operating conditions raises an important issue of how to update the predistortion coefficients applied to the transceiver 10 after it has been shipped out by its manufacturer and installed at a remote site by its operator. According to some embodiments of the present application, a method of calibrating a microwave radio transceiver so that an appropriate set of predistortion coefficients is applied to the transceiver for a given set of operating conditions is disclosed below in connection with FIGS. 2A and 2B. The calibration method includes two stages: the first stage of the calibration happens at the manufacturing site where a DPD lookup table is generated and installed into each individual transceiver and the second stage of the calibration occurs at the operation site where a set of predistortion coefficients is dynamically determined using the DPD lookup table for a given set of operating conditions and applied to the transceiver.

Figure 2A:
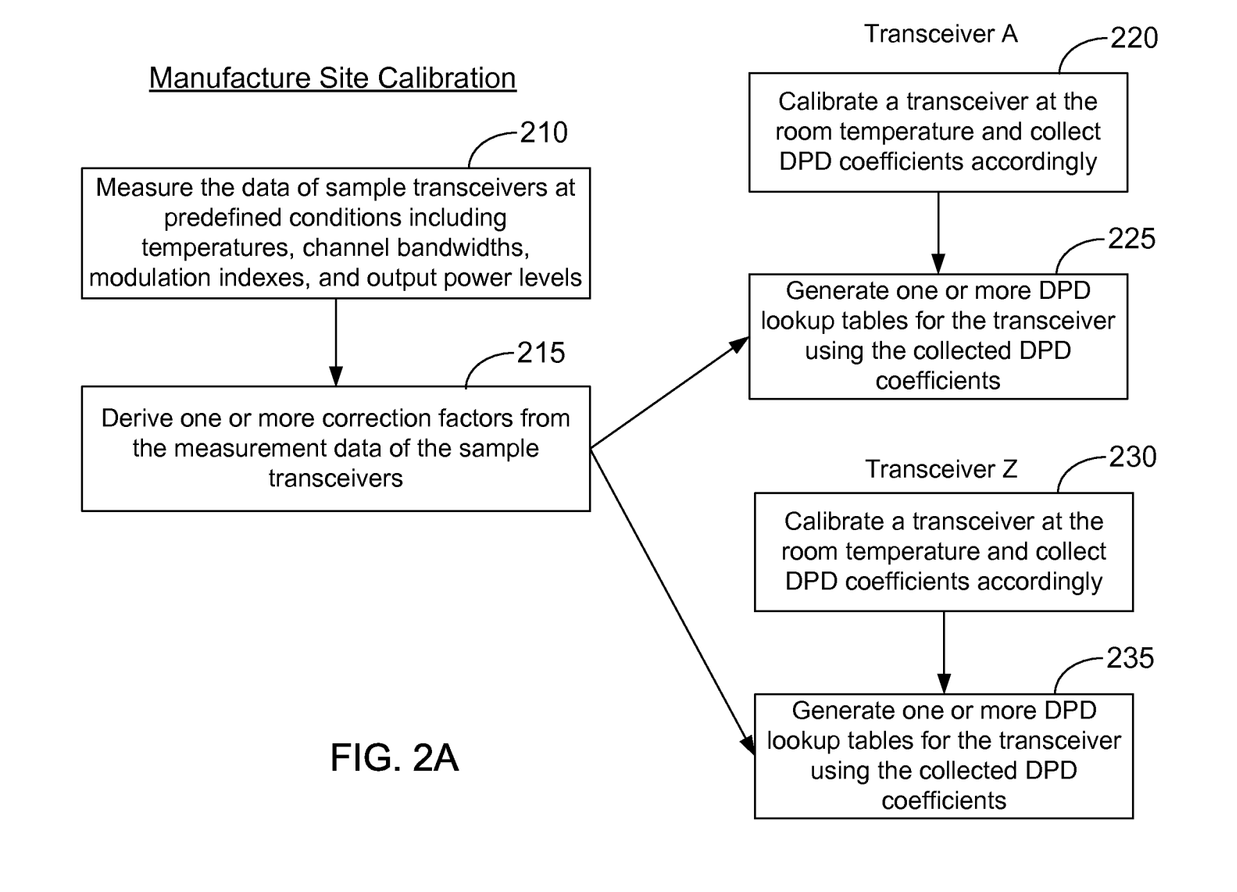
FIG. 2A depicts a flow chart of calibrating microwave radio transceivers at a manufacturing site in accordance with some embodiments of the present invention.

FIG. 2A depicts a flow chart of calibrating microwave radio transceivers at the manufacturing site in accordance with some embodiments of the present invention. In order to calibrate the microwave radio transceivers, the manufacturer first measures (210) data of one or more sample transceivers at predefined conditions. The predefined conditions include a combination of temperatures, frequencies, channel bandwidths, modulation indexes, and output transmit power levels. From the measurements of the sample transceivers, the manufacturer derives (215) one or more correction factors that will be applied to the transceivers to be calibrated. In some embodiments, a correction factor for a particular combination of frequency, channel bandwidth, temperature and output transmit power level is determined by subtracting the averaged DPD coefficients of the sample transceivers at the same frequency, temperature, and output transmit power level but over different channel bandwidths from the averaged DPD coefficients of the sample transceivers at the same frequency, channel bandwidth, room temperature of 25° C., and output transmit power level:

$$C(F,BW,T,P) = \text{Avr}_i(G_i(F,BW,25°\text{ C.},P)) - \text{Avr}_{i,j}(G_i(F,T,P))$$

where:
C is the correction factor;
$G_i$ is the DPD coefficient of the same transceiver "i";
F is the frequency;
T is the temperature;
BW is the channel bandwidth;
P is the output transmit power level;
$\text{Avr}_i(G_i)$ is the average of all the DPD coefficients over all the sample transceivers for a particular channel bandwidth at the room temperature of 25° C.; and
$\text{Avr}_{i,j}(G_{i,j})$ is the average of all the DPD coefficients over all the sample transceivers at different bandwidths for a particular temperature T.

For each target transceiver A to Z, a technician at the manufacturing site first calibrates (220, 230) the transceiver's performance at the room temperature for a plurality of predefined conditions, each corresponding to a predefined frequency F, channel bandwidth BW and output transmit power level P, and collects the corresponding DPD coefficients, $G_A$(F, BW, 25° C., P) to $G_Z$(F, BW, 25° C., P). Note that the room temperature 25° C. is for illustrative purposes only and it could be replaced with other temperatures. Next, a DPD lookup table is generated (225, 235) for each transceiver A to Z by applying a respective set of correction factors to the DPD coefficients collected in the previous step for a plurality of predefined conditions as follows:

$$G_k(F,BW,T,P) = G_k(F,BW,25°\text{ C.},P) + C(F,BW,T,P)$$

where:
C is the correction factor;
$G_k$ is the DPD coefficient of the target transceiver "k" ranging from A to Z;
F is the frequency;
T is the temperature;
BW is the channel bandwidth; and
P is the output transmit power level.

Figure 2B:
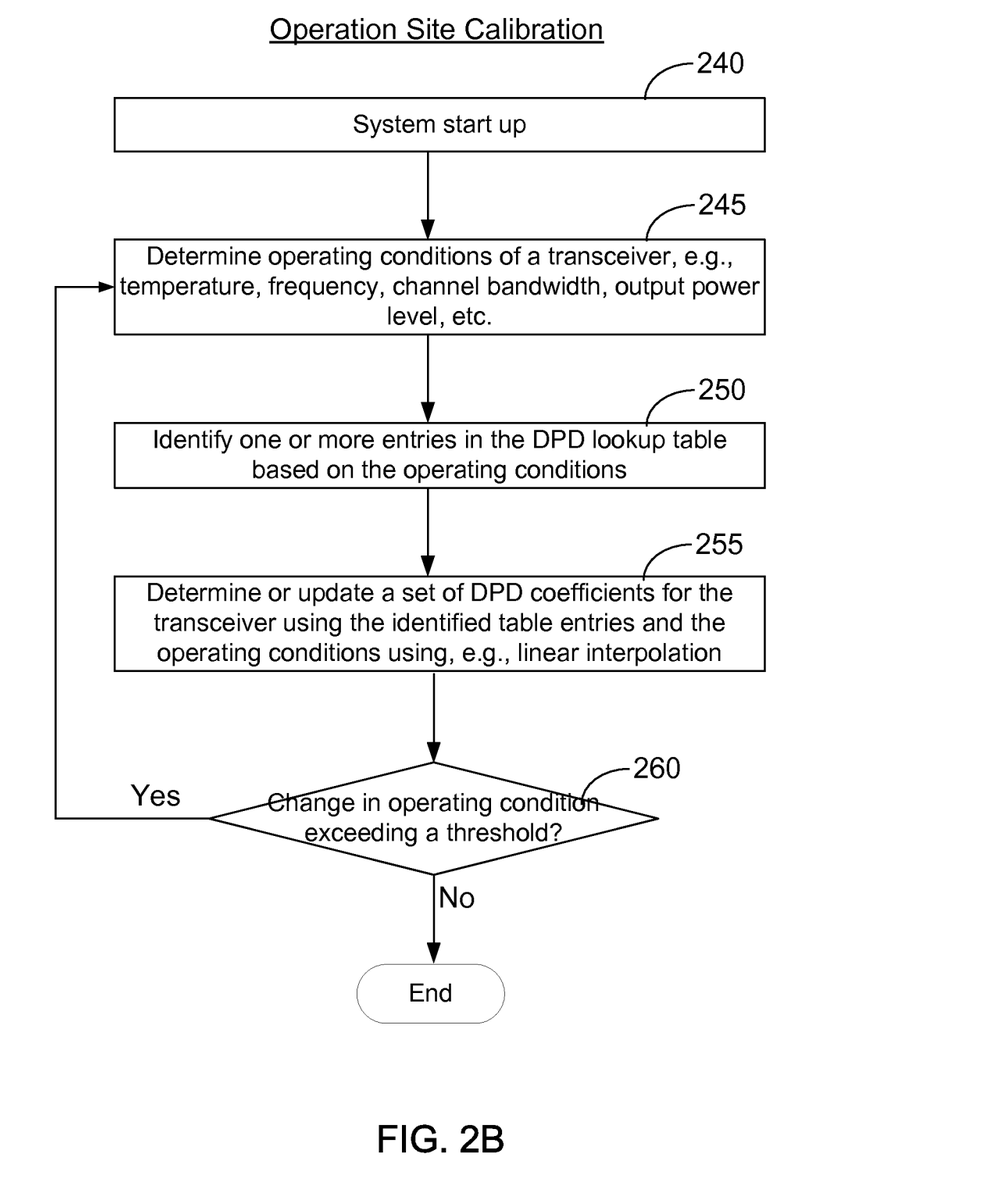
FIG. 2B depicts a flow chart of calibrating a microwave radio transceiver at an operation site in accordance with some embodiments of the present invention.

The DPD lookup table is stored in the memory of the target transceiver for subsequent use at an operation site. At the operation site, the transceiver is built into a microwave radio system for exchanging signals with other equipment. FIG. 2B depicts a flow chart of calibrating a microwave radio transceiver at an operation site in accordance with some embodiments of the present invention. After powered on, the transceiver enters the system startup mode (240). As part of the system startup process, the transceiver automatically determines (245) its current operating conditions, including temperature, frequency, channel bandwidth, and output transmit power level, etc. Using the determined parameters, a DPD engine queries (250) the DPD lookup table to identify one or more entries in the DPD lookup table based on the operating conditions. For example, if the current temperature at the operation site is 34° C., two entries are identified in the table, one corresponding to the temperature of 30° C. and the other corresponding to the temperature of 35° C., assuming that the other operating conditions are the same for the two table entries. Next, the DPD engine determines (255) a set of DPD coefficients for the transceiver based on the current operating conditions using, e.g., linear interpolation. In some embodiments, the transceiver may be using a set of DPD coefficients corresponding to a different set of operating conditions. The DPD engine then determines an update to the set of DPD coefficients and applies the update to the set of DPD coefficients currently in use. In either case, the DPD engine applies the set of DPD coefficients to the target transceiver to improve its linear performance. In some embodiments, many of the operating conditions vary over time, which may require a change to the predistortion coefficients to maintain the transceiver's linear performance. For example, the DPD engine may regularly check the operating conditions and determine (260) if there is any change in the operating conditions exceeding a predefined threshold. When this happens (260—yes), the DPD engine then repeats the operations shown in the figure and determines a new set of DPD coefficients to be applied to the transceiver.

The division of the calibration process into two stages, one happening at the manufacturing site and the other one at the operation site, makes it possible for a transceiver to dynamically update its predistortion coefficients with minimum interference from a human technician. In addition, the allocation of a portion of the calibration task to the operation site reduces the workload at the manufacturing site.

As noted above, multiple operating conditions may affect the linear performance of a microwave radio transceiver. Certain condition changes (e.g., temperature) are caused by the surrounding environment and it may take some time for such changes to adversely affect the linear performance of the transceiver. Other condition changes (e.g., the change of transmit power level) may have a more immediate impact on the transceiver's performance. In this case, the DPD engine needs to coordinate with other components in the system in order to reduce the impact of the condition changes on the linear performance of the transceiver.

Figure 3A:
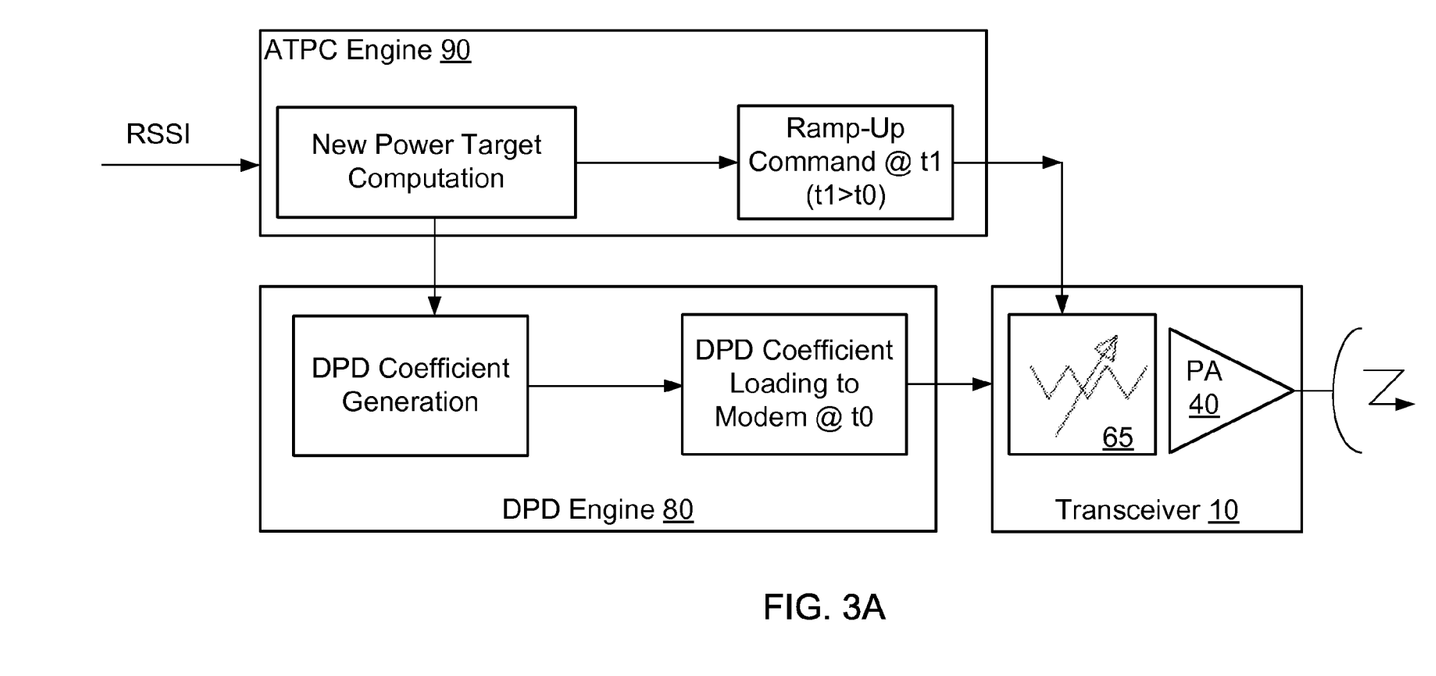
FIG. 3A depicts a block diagram of performing digital predistortion to a power amplifier before an increase of transmit power level at the power amplifier in accordance with some embodiments of the present invention.
Figure 3B:
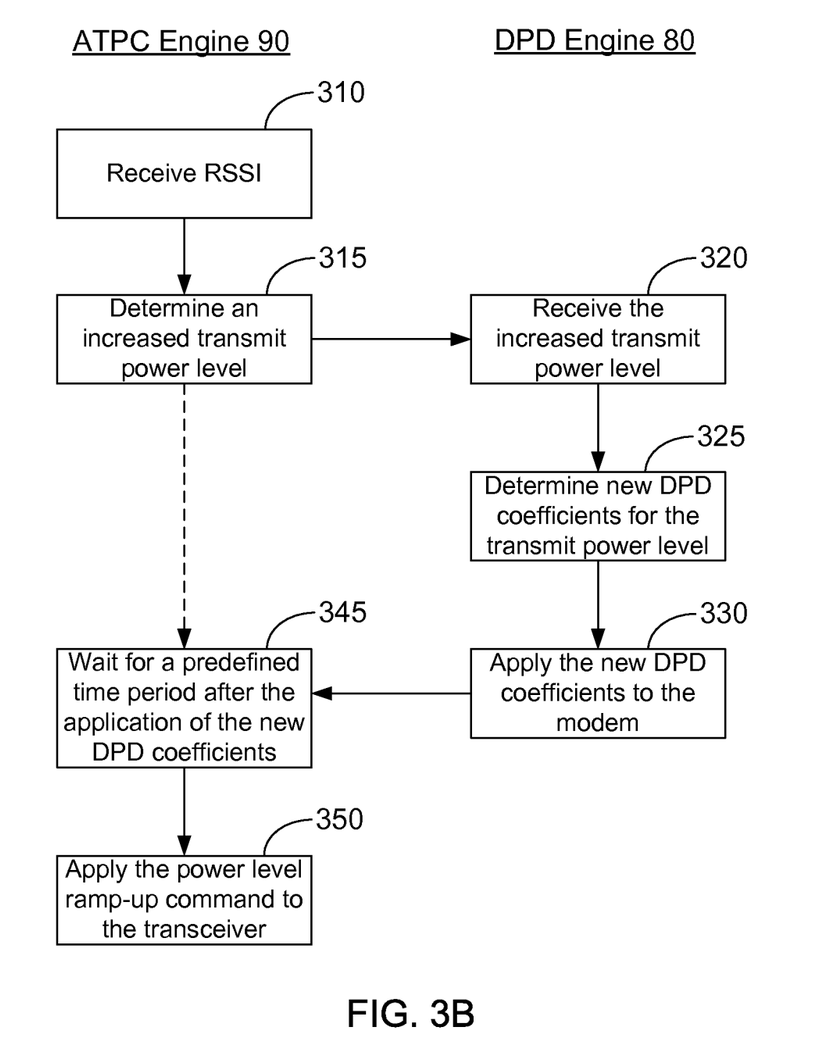
FIG. 3B depicts a flow chart of how the ATPC engine and the DPD engine interact with each other to perform digital predistortion to a power amplifier before an increase of transmit power level at the power amplifier in accordance with some embodiments of the present invention.

FIG. 3A depicts a block diagram of performing digital predistortion to a power amplifier before an increase of transmit power level at the power amplifier in accordance with some embodiments of the present invention. The microwave radio system includes a transceiver 10, an ATPC engine 90, and a DPD engine 80. There is a power amplifier 40 in the transceiver 10. The ATPC engine 90 adjusts the transmit power level of the power amplifier 40 through a variable attenuator 65. FIG. 3B depicts a flow chart of how the ATPC engine 90 and the DPD engine 80 interact with each other to perform the digital predistortion to the power amplifier 40 before an increase of transmit power level at the power amplifier 40 in accordance with some embodiments of the present invention. At a predefined moment in time, the ATPC engine 90 receives (310) an RSSI. Based on the RSSI, the ATPC engine 90 determines (315) an increased transmit power level and sends the increased transmit power level to the DPD engine 80. Upon receipt of the increased transmit power level (320), the DPD engine 80 determines (325) a set of new DPD coefficients for the transmit power level and then applies (330) the new DPD coefficients to the modem at the moment $t_0$. Generally, there is a time delay for the new DPD coefficients to take effect at the power amplifier. If the ATPC engine 90 applies a power level ramp-up command to the transceiver immediately without waiting for the DPD coefficients to take effect at the power amplifier, the power amplifier may experience a temporary deterioration of its linear performance. Therefore, the ATPC engine 90 is configured to wait (345) for a predefined time period (e.g., 5 ms) after the application of the new DPD coefficients before applying (350) the power level ramp-up command to the transceiver at $t_1$. The predefined time period ($t_1$-$t_0$) is designed so that the new DPD coefficients have taken effect at the power amplifier.

Figure 4A:
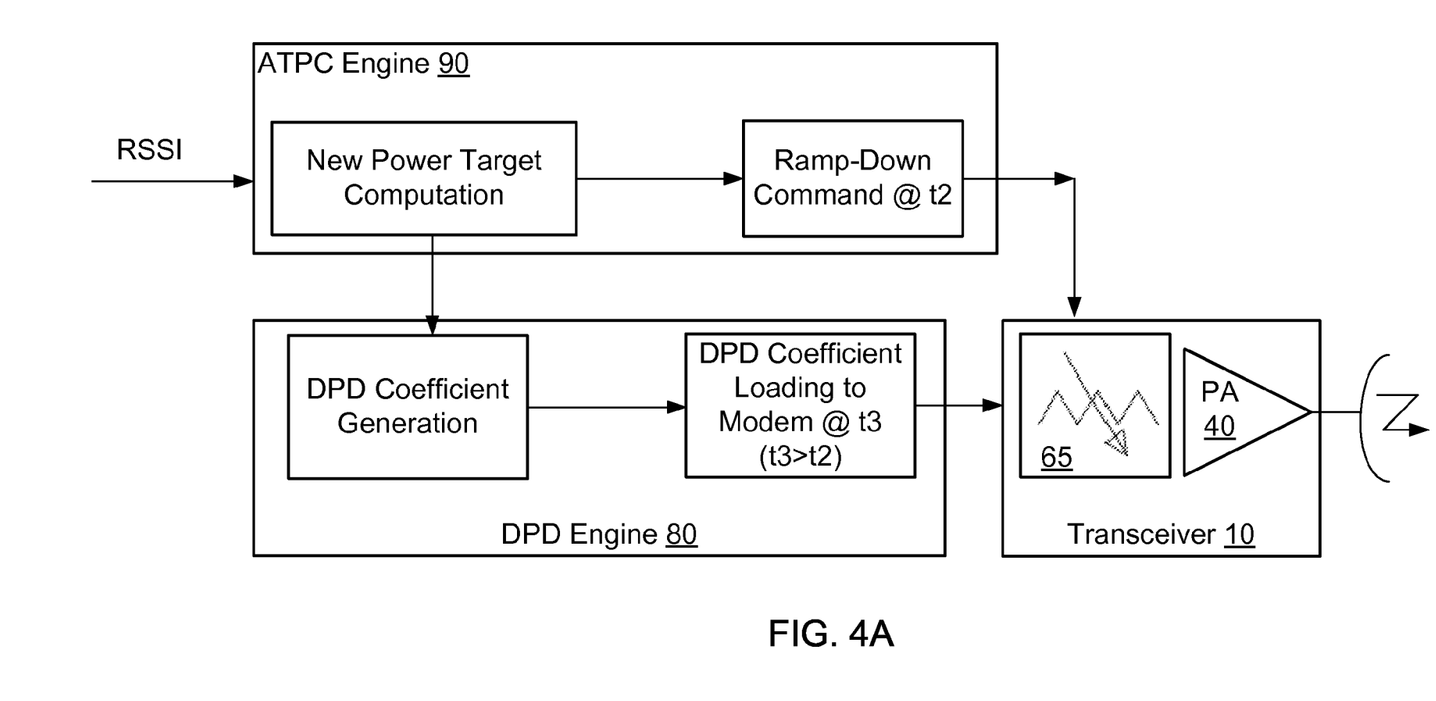
FIG. 4A depicts a block diagram of performing digital predistortion to a power amplifier after a decrease of transmit power level at the power amplifier in accordance with some embodiments of the present invention.
Figure 4B:
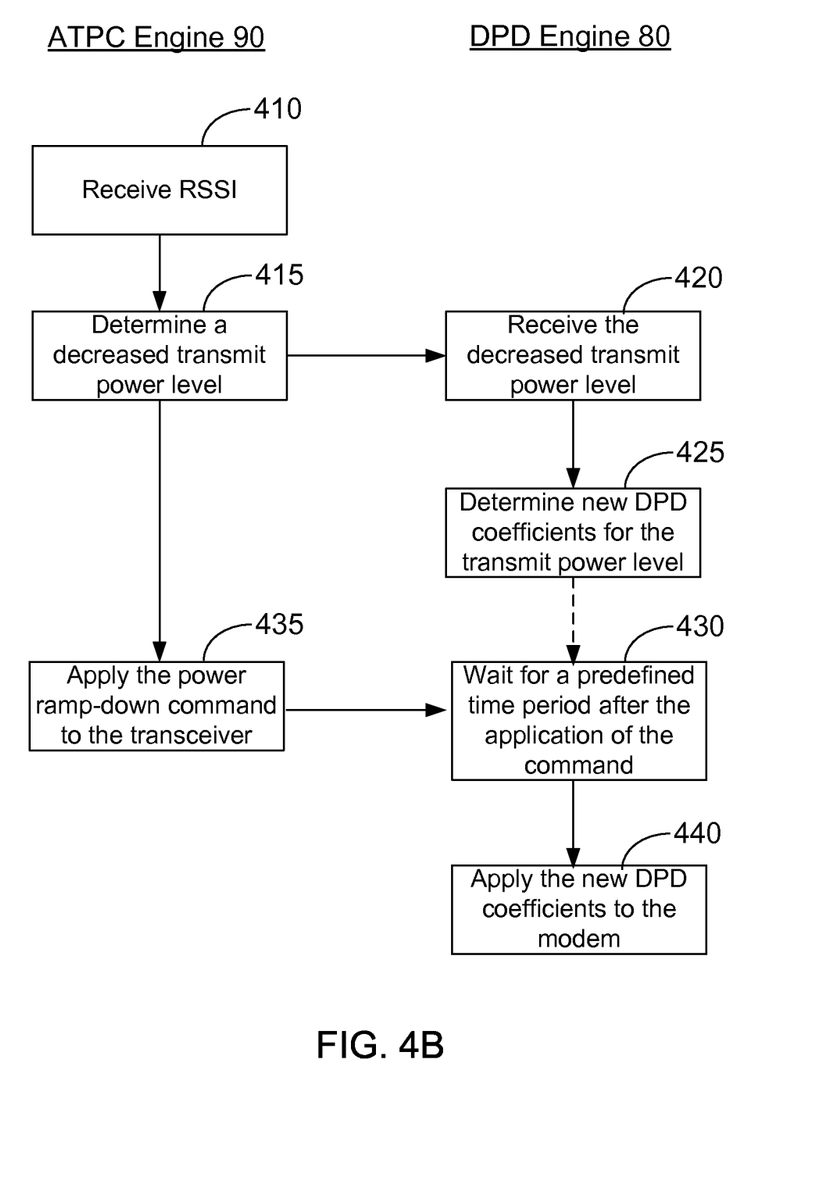
FIG. 4B depicts a flow chart of how the ATPC engine and the DPD engine interact with each other to perform digital predistortion to a power amplifier after a decrease of transmit power level at the power amplifier in accordance with some embodiments of the present invention.

FIG. 4A depicts a block diagram of performing digital predistortion to a power amplifier after a decrease of transmit power level at the power amplifier in accordance with some embodiments of the present invention. FIG. 4B depicts a flow chart of how the ATPC engine 90 and the DPD engine 80 interact with each other to perform digital predistortion to a power amplifier after a decrease of transmit power level at the power amplifier 40 in accordance with some embodiments of the present invention. At a predefined moment in time, the ATPC engine 90 receives (410) an RSSI. Based on the RSSI, the ATPC engine 90 determines (415) a decreased transmit power level and sends the decreased transmit power level to the DPD engine 80. Upon receipt of the decreased transmit power level (420), the DPD engine 80 determines (425) a set of new DPD coefficients for the transmit power level. But instead of applying the new DPD coefficients to the modem immediately, the ATPC engine 90 first applies (435) a power level ramp-down command to the transceiver at the moment $t_2$ and the DPD engine 80 waits (430) for a predefined time delay of ($t_3$-$t_2$) (e.g., 100 ms) before applying (440) the DPD coefficients to the modem. The reason for this time delay is similar to the one described above in connection with FIGS. 3A and 3B because a sudden change of the DPD coefficients may cause the power amplifier to experience a temporary deterioration of its linear performance since its output transmit power level is still at a relatively high level.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

We claim:

1. A microwave radio transceiver control system, comprising:

an adaptive transmit power control (ATPC) engine communicatively coupled to the microwave radio transceiver, the ATPC engine configured for receiving a received signal strength indication (RSSI), determining a new transmit power level for the microwave radio transceiver in accordance with the RSSI, and issuing a transmit power level increase/decrease command to the microwave radio transceiver; and a digital predistortion (DPD) engine communicatively coupled to the microwave radio transceiver and the ATPC engine, respectively, the DPD engine configured for receiving the new transmit power level from the ATPC engine and determining a set of DPD coefficients to be applied to the microwave radio transceiver in accordance with a predefined set of current operating conditions and the new transmit power level and applying the set of DPD coefficients to the microwave radio transceiver, wherein:
when the new transmit power level is higher than the microwave radio transceiver's current transmit power level:
first, the DPD engine is configured to apply the set of DPD coefficients to the microwave radio transceiver; and
second, the ATPC engine is configured to issue a transmit power level increase command to the microwave radio transceiver after a first predefined time interval following the application of the set of DPD coefficients to the microwave radio transceiver; and
when the new transmit power level is lower than the microwave radio transceiver's current transmit power level:
first, the ATPC engine is configured to issue a transmit power level decrease command to the microwave radio transceiver; and
second, the DPD engine is configured to apply the set of DPD coefficients to the microwave radio transceiver after a second predefined time interval following the issuance of the transmit power level decrease command to the microwave radio transceiver.

2. The microwave radio transceiver control system of claim 1, wherein the DPD engine is configured to perform a query over a DPD lookup table in accordance with a predefined set of operating conditions and the new transmit power level to determine the set of DPD coefficients.

3. The microwave radio transceiver control system of claim 1, wherein the DPD engine is configured to provide the determined set of DPD coefficients to a modem and the modem is configured to use the set of DPD coefficients to modify an analog signal in accordance with a predefined odd-order polynomial and apply the analog signal to the microwave radio transceiver.

4. The microwave radio transceiver control system of claim 1, wherein each of the set of DPD coefficients is a complex number represented by a pair of real and imaginary components.

5. The microwave radio transceiver control system of claim 1, wherein the microwave radio transceiver includes a power amplifier to which the set of DPD coefficients is applied.

6. The microwave radio transceiver control system of claim 1, wherein the predefined set of operating conditions includes one or more parameters selected from the group consisting of a radio frequency, a channel bandwidth, a modulation index, and a transmit power level.

7. The microwave radio transceiver control system of claim 1, wherein the first predefined time interval is 5 ms.

8. The microwave radio transceiver control system of claim 1, wherein the second predefined time interval is 100 ms.

9. A method for performing digital predistortion to a microwave radio transceiver, comprising:
receiving a received signal strength indication (RSSI);
in response to the RSSI:
determining a new transmit power level for the microwave radio transceiver; and
performing a query over a DPD lookup table in accordance with a predefined set of current operating conditions and the new transmit power level to determine a set of DPD coefficients to be applied to the microwave radio transceiver;
when the new transmit power level is higher than the microwave radio transceiver's current transmit power level:
first, applying the set of DPD coefficients to the microwave radio transceiver; and
second, issuing a transmit power level increase command to the microwave radio transceiver after a first predefined time interval following the application of the set of DPD coefficients to the microwave radio transceiver; and
when the new transmit power level is lower than the microwave radio transceiver's current transmit power level:
first, issuing a transmit power level decrease command to the microwave radio transceiver; and
second, applying the set of DPD coefficients to the microwave radio transceiver after a second predefined time interval following the issuance of the transmit power level decrease command to the microwave radio transceiver.

10. The method of claim 9, further comprising:
applying the set of DPD coefficients to a modem, wherein the modem is configured to use the set of DPD coefficients to modify an analog signal in accordance with a predefined odd-order polynomial and apply the analog signal to the microwave radio transceiver.

11. The method of claim 9, wherein each of the set of DPD coefficients is a complex number represented by a pair of real and imaginary components.

12. The method of claim 9, wherein the microwave radio transceiver includes a power amplifier and the set of DPD coefficients is to be applied to the power amplifier.

13. The method of claim 9, wherein the predefined set of operating conditions includes one or more parameters selected from the group consisting of a radio frequency, a channel bandwidth, a modulation index, and a transmit power level.

14. The method of claim 9, wherein the first predefined time interval is 5 MS.

15. The method of claim 9, wherein the second predefined time interval is 100 ms.

* * * * *